United States Patent [19]
Watabe et al.

[11] Patent Number: 5,766,305
[45] Date of Patent: Jun. 16, 1998

[54] METAL POWDER COMPOSITION FOR METALLIZATION AND A METALLIZED SUBSTRATE

[75] Inventors: Youhei Watabe; Shinichi Iwata; Tomeji Ohno, all of Miyagi, Japan

[73] Assignee: Tokin Corporation, Miyagi, Japan

[21] Appl. No.: 711,897

[22] Filed: Sep. 12, 1996

Related U.S. Application Data

[63] Continuation-in-part of Ser. No. 247,868, May 23, 1994, abandoned.

[30] Foreign Application Priority Data

Oct. 21, 1992 [JP] Japan ..................... 4-282869

[51] Int. Cl.6 ........................................ B22F 1/00
[52] U.S. Cl. ................................... 75/255; 420/492
[58] Field of Search ......................... 75/255; 420/492

[56] References Cited

U.S. PATENT DOCUMENTS 3,994,734   11/1976   Cuthbert ..................... 75/255

FOREIGN PATENT DOCUMENTS

| 4613025 | 4/1971 | Japan . |
| 4613026 | 4/1971 | Japan . |
| 6082676 | 5/1985 | Japan . |
| 3046705 | 2/1991 | Japan ..................... 75/255 |
| 3047901 | 2/1991 | Japan ..................... 75/255 |
| 4280880 | 6/1992 | Japan . |
| 9409182 | 4/1994 | Japan . |

*Primary Examiner*—Scott Kastler
*Attorney, Agent, or Firm*—Hopgood, Calimafde, Kalil & Judlowe

[57] ABSTRACT

A metal powder composition for metallization is for use in forming a metallized film from a paste comprising Cu and Ti powder and consists essentially of about 95 to 99.5% Cu and 0.5 to less than 5% Ti by weight. The above-mentioned paste is then applied onto a substrate and then fired to provide a metallized substrate.

2 Claims, 3 Drawing Sheets

Fig. 3

| SUBSTRATE MATERIAL | CONVEN-TIONAL | THIS INVENTION | | |
|---|---|---|---|---|
| | | Cu 99.7%<br>Ti 0.3% | Cu 99.5%<br>Ti 0.5% | Cu 95%<br>Ti 5% |
| ALUMINUM NITRIDE | 4.0 | 1.5 | 4.0 | 5.5 |
| ALUMINA | 4.0 | 2.0 | 4.5 | 6.0 |

UNIT: Kg

METAL POWDER COMPOSITION FOR METALLIZATION AND A METALLIZED SUBSTRATE

This application is a continuation-in-part of U.S. Ser. No. 08/247,868 filed on May 23, 1994, now abandoned.

TECHNICAL FIELD

This invention relates to a metal powder composition for metallization which is for use in forming a conductor layer of a thick-film electronic circuit and in forming a copper circuit to diffuse heat generated by operation of elements and parts mounted on a ceramics substrate for an electronic apparatus, and also relates to a metallized substrate.

BACKGROUND ART

Generally, a substrate for an electronic circuit is required to have several characteristics, namely, to assure an excellent insulation property and a high mechanical strength, to prevent deterioration of electronic elements mounted thereon, to readily form a bond with a metal conductor, and to exhibit a high heat conductivity. Such a substrate can be made of alumina ceramics, nitride ceramics, and the like. On a single ceramics body, however, it is impossible to directly mount transistors, diodes, IC's, LSI's, and various other electronic parts used in an electronic apparatus.

In view of the above, a conventional electronic circuit is assembled by the use of a metallized film formed on a surface of the ceramics substrate. The metallized film is used as a conductor layer itself of serves to bond the ceramics substrate to a metal conductor. Preferably, the conductor layer or the metal conductor, is made of an inexpensive material having a small electric resistance, i.e., a substantially high electrical conductivity. Generally, copper is used. Heretofore, the metallized film is formed on the ceramics substrate by the steps of screen-printing a copper conductor paste onto the ceramics substrate to a thickness 10 and 30 µm, drying the paste, and then firing the paste in a nitrogen atmosphere to form the circuit.

The metallized film formed on the ceramics substrate according to the above-mentioned method may be made of a copper conductor paste containing glass frit for nitride or oxide. However, a vertical tensile test for a square pad of 2 mm long revealed that the bonding strength between the ceramics substrate and the metallized film was no more than about 2 kg. In a high-temperature aging test at 150° C., the bonding strength was reduced to less than a half of its initial value after the lapse of 100 hours or so. A copper paste for nitride ceramics having increased bonding strength and improved reliability is not presently available.

On the other hand, Japanese Patent Publication JP-A-H04-280880 discloses a metal powder paste having a composition consisting essentially of 70 to 95 wt % Cu and 5 to 30 wt % Ti. This metal powder paste is free from deterioration at a high temperature and has an increased bonding strength for nitride and oxide. However, this paste is expensive and has a higher electric resistance than Cu because of its increased content of Ti. However, if the Ti content is reduced to 5 wt % or less, the bond with the ceramics substrate is extremely weak.

In view of the above, it is an object of the present invention to provide a metal powder composition for metallization, which is capable of providing a metallized film exhibiting an increased bonding strength and improved reliability in an environmental test where the Ti content is less than about 5 wt %, and to provide a metallized substrate.

DISCLOSURE OF THE INVENTION

According to this invention, there is provided a metal powder composition for metallization which is for use in forming a metallized film from a paste comprising Cu and Ti powder having a reduced particle size as fine as 10 µm or less, characterized in that the composition consists essentially of 95 to 99.5% Cu and about 0.5 to less than 5% Ti in weight ratio.

According to the present invention, there is also provided a metallized ceramic substrate which is formed by applying, onto a surface of a ceramic substrate, a paste comprising the above-mentioned metal powder composition for metallization and a predetermined vehicle component, and then carrying out firing in a vacuum or an inactive gas atmosphere.

According to this invention, there is also provided a metallized ceramics substrate which is formed by applying, onto a surface of a ceramic substrate, a paste comprising the above-mentioned metal powder composition for metallization and a predetermined vehicle component, placing a metal foil on the paste, and thereafter carrying out firing in a vacuum or an inactive gas atmosphere to bond the metal foil.

BRIEF DESCRIPTION OF THE DRAWING

FIG. 3 shows a test for a copper foil used to form the metallized film according to the invention.

BEST MODE FOR EMBODYING THE INVENTION

Now, description will be made as regards several embodiments of this invention.

First Embodiment

A metal powder composition for metallization according to an embodiment of this invention essentially consists of 95 to 99.5% Cu as a main component and 0.5 to less than 5% Ti in weight %.

Fine copper powder (Cu) and titanium fine powder (Ti) having an average particle size not greater than 10 µm were preliminarily classified to be adjusted so that a metal component in a final paste form would have a particle size not greater than 13 µm but not less than 2 µm. Generally, the powder having a smaller particle size is more readily bonded to oxygen in the atmosphere to form oxide. This may result in deterioration of the bonding strength to the ceramics substrate. In this connection, classification of the metal powder was carried out in a nonoxidizing atmosphere. The Cu powder and the Ti powder obtained by classification and having different particle sizes were weighed and mixed into a predetermined composition ratio. Thus, the metal powder composition was prepared.

To the metal powder composition thus obtained, a commonly-used vehicle including a binder component of acrylic resin was added and sufficiently blended and dispersed by the use of a triple-roll mill. Thus, a paste adapted to screen printing was obtained. As regards the particle size of the paste, grinding particle sizes of the metal powder composition were graded by a particle gauge with respect to a maximum particle size of a conductor paste.

Figure 1:
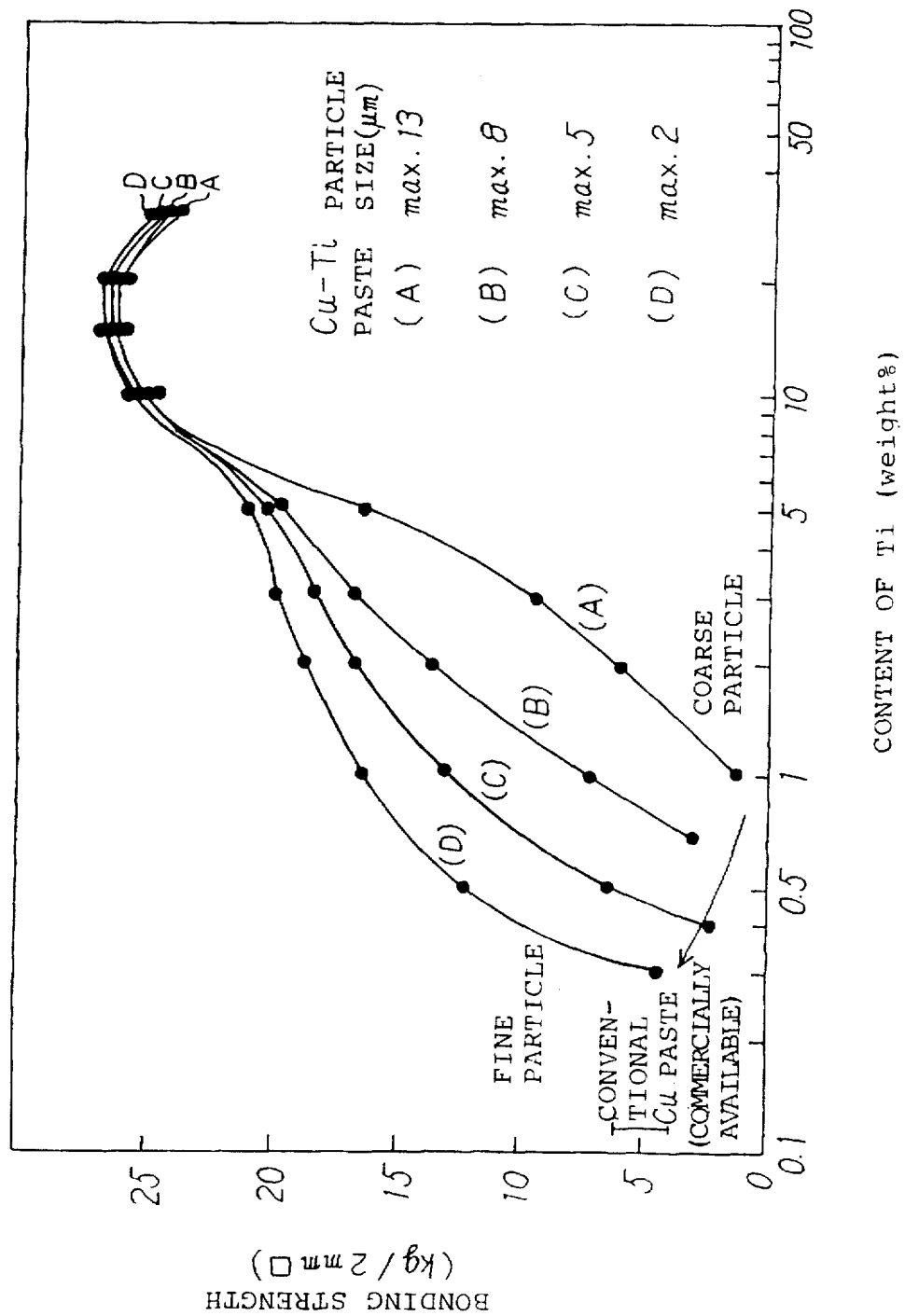
FIG. 1 shows a result of measurement of a bonding strength in a vertical tensile test for a metallized film produced in accordance with the present invention.

The paste according to this invention was printed on an aluminum nitride ceramic substrate and fired in vacuum to form a metallized substrate. FIG. 1 shows the bonding strength as a result of a vertical tensile test for a square pad of 2 mm long. The figure also shows, as a comparative example, those values obtained for a conventional copper paste containing glass frit and used in the aluminum nitride ceramic substrate.

According to this embodiment, when the content of Ti is not less than 10%, no substantial difference in bonding strength is observed irrespective of the scale of the particle size of the paste. When the content of Ti is less than 5%, the bonding strength increases when the particle size of the paste is reduced from a coarse-grained condition to a fine-grained condition. The paste of a smaller particle size has a remarkable effect upon the bonding strength particularly when the content of Ti is less than 5%. It is thus possible t o make the metallized film have a greater bonding strength than the conventional copper paste containing glass frit even when the content of Ti is small, that is, less than 5% by weight.

Figure 2:
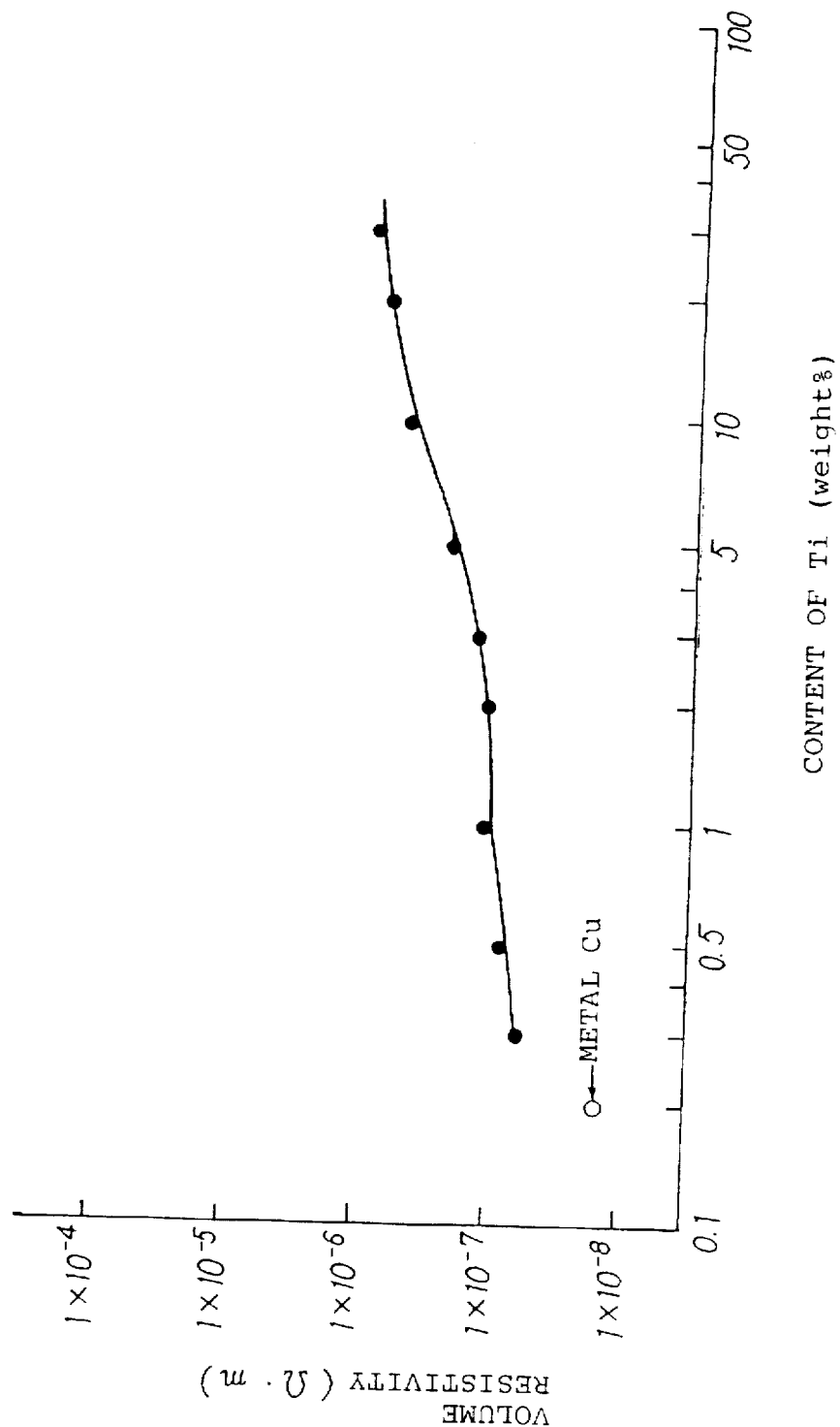
FIG. 2 shows a result of measurement of a volume resistivity of the metallized film according to the invention.

FIG. 2 s hows a volume resistivity of the metallized film which was prepared according to the aforementioned embodiment. A decrease in volume resistivity is achieved by reducing the content of Ti, particularly when the content of Ti is less than 5%.

As described above, the paste comprising a fine-grained component according to this invention provides a metallized film having in increased bonding strength to the aluminum nitride ceramic substrate when the Ti content of the composition is controlled at less than 5% by weight. This paste does not contain glass frit. Accordingly, no deterioration of the bonding strength was observed in a high-temperature aging test at 150° C. for 1000 hours thereby confirming the high reliability attained with the invention. In addition, the composition in the above-mentioned range of less than 5% Ti successfully decreases the volume resistivity to a level lower than the conventional level.

Second Embodiment

The paste according to this invention was prepared in the manner similar to the first embodiment, printed on a 96% alumina ceramics substrate, and fired in a vacuum to provide a metallized substrate. The similar test was carried out for a square pad of 2 mm long. As a result, it was confirmed that the bonding strength was as high as 15 kg and 18 kg at the Ti content of 0.5% and 1%, respectively, when the average particle size was equal to about 2 µm. As to the volume resistivity, a similar result was obtained as in the first embodiment.

Third Embodiment

The paste according to this invention was prepared in the manner similar to the first embodiment and printed and applied onto an aluminum nitride ceramics substrate and an alumina ceramics substrate, respectively. A copper foil having a thickness of 0.3 mm was placed on the paste and fired in a vacuum to form a bond. FIG. 3 shows a result of measurement of the bonding strength in a peeling test for a copper foil having a width of 2 mm. A comparative example is also illustrated and shows a result of measurement for the similar copper foil which was bonded by the use of a conventional solder material.

As seen from the results illustrated in FIG. 3, the paste according to the third embodiment of this invention maintains the bonding strength between the copper foil and the ceramics substrate at a level equal to or superior to that obtained with the solder material in the conventional example, when the content of Ti is within a range between 0.5% and less than 5%.

Effect of the Invention

According to the invention, the paste using the Cu and Ti powder contains the metal powder component of a reduced particle size. As a result, the bonding strength between the metallized film and the ceramics substrate is increased to a sufficient level in practical use, even when the content of Ti has a small value between about 0.5 and less than 5%. It is thus possible to provide a metal powder composition for metallization capable of forming a metallized film which is highly reliable and which has a small volume resistivity, and to provide a metallized substrate.

INDUSTRIAL APPLICABILITY

As described above, the metal powder composition for metallization and the metallized substrate according to this invention are adapted to form the conductor layer of the thick-film electronic circuit on the ceramics substrate, and to form a copper circuit on the ceramics substrate in order to diffuse heat generated by operation of the elements and the parts mounted on the ceramics substrate for the electronic apparatus.

What is claimed is:

1. A metallizing powder composition for use in forming a metallized film on a ceramic substrate, said composition consisting essentially of a paste of a powder mixture of copper and titanium, said titanium ranging from about 0.5% to about 1% by weight with the balance of said mixture consisting essentially of copper, said powder composition having an average particle size ranging from about 2 µm and not greater than about 13 µm, said metallized film being produced by mixing said powder in a vehicle containing a binder component and blending said mixture to form a paste which is applied as a layer to a ceramic substrate followed by applying a metal foil onto the paste, and firing said substrate with said layer of paste and metal foil thereon to produce a bonded metallized film on said substrate.

2. The metallizing powder composition as in claim 1, wherein said metallized substrate obtained therefrom is produced by applying said paste between a ceramic substrate and a copper foil to form a combination thereof, and thereafter firing said combination to thereby bond said ceramic substrate and said copper foil.

\* \* \* \* \*